United States Patent
Bobde et al.

(10) Patent No.: US 9,530,885 B2
(45) Date of Patent: Dec. 27, 2016

(54) NORMALLY ON HIGH VOLTAGE SWITCH

(71) Applicant: Alpha and Omega Semiconductor Incorporated, Sunnyvale, CA (US)

(72) Inventors: Madhur Bobde, Santa Clara, CA (US); Hamza Yilmaz, Saratoga, CA (US); Daniel Calafut, San Jose, CA (US); Karthik Padmanabhan, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/736,197

(22) Filed: Jun. 10, 2015

(65) Prior Publication Data

US 2015/0279989 A1    Oct. 1, 2015

Related U.S. Application Data

(63) Continuation of application No. 13/945,784, filed on Jul. 18, 2013, now Pat. No. 9,082,790.

(51) Int. Cl.

| | |
|---|---|
| *H01L 29/78* | (2006.01) |
| *H01L 29/66* | (2006.01) |
| *H01L 29/40* | (2006.01) |
| *H01L 29/423* | (2006.01) |
| *H01L 29/49* | (2006.01) |
| *H01L 21/02* | (2006.01) |
| *H01L 21/28* | (2006.01) |
| *H01L 29/06* | (2006.01) |
| *H01L 29/808* | (2006.01) |
| *H01L 21/265* | (2006.01) |

(52) U.S. Cl.
CPC ..... *H01L 29/7827* (2013.01); *H01L 21/02164* (2013.01); *H01L 21/28035* (2013.01); *H01L 29/0634* (2013.01); *H01L 29/0696* (2013.01); *H01L 29/407* (2013.01); *H01L 29/4236* (2013.01); *H01L 29/4916* (2013.01); *H01L 29/66666* (2013.01); *H01L 29/66734* (2013.01); *H01L 29/7813* (2013.01); *H01L 29/7828* (2013.01); *H01L 29/7832* (2013.01); *H01L 29/8083* (2013.01); *H01L 21/26586* (2013.01)

(58) Field of Classification Search
USPC .......................................... 257/330; 438/270
See application file for complete search history.

(56) References Cited

U.S. PATENT DOCUMENTS

| | | | |
|---|---|---|---|
| 6,380,569 B1* | 4/2002 | Chang | H01L 29/0623 257/107 |
| 2014/0145206 A1* | 5/2014 | Siemieniec | H01L 29/66348 257/77 |

* cited by examiner

*Primary Examiner* — Zandra Smith
*Assistant Examiner* — Lawrence Tynes, Jr.
(74) *Attorney, Agent, or Firm* — Van Pelt, Yi & James LLP

(57) ABSTRACT

In some embodiments, a normally on high voltage switch device ("normally on switch device") incorporates a trench gate terminal and buried doped gate region. In other embodiments, a surface gate controlled normally on high voltage switch device is formed with trench structures and incorporates a surface channel controlled by a surface gate electrode. The surface gate controlled normally on switch device may further incorporate a trench gate electrode and a buried doped gate region to deplete the conducting channel to aid in the turning off of the normally on switch device. The normally on switch devices thus constructed can be readily integrated with MOSFET devices and formed using existing high voltage MOSFET fabrication technologies.

20 Claims, 7 Drawing Sheets

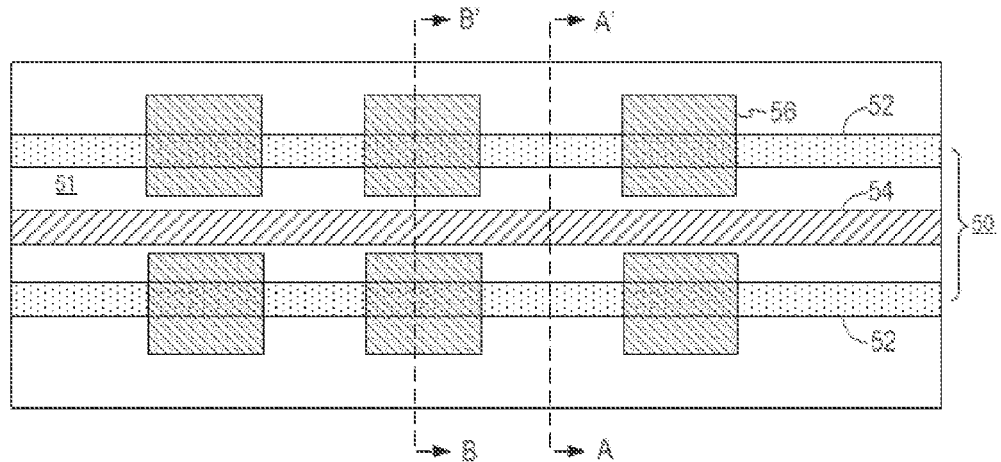
FIG. 2
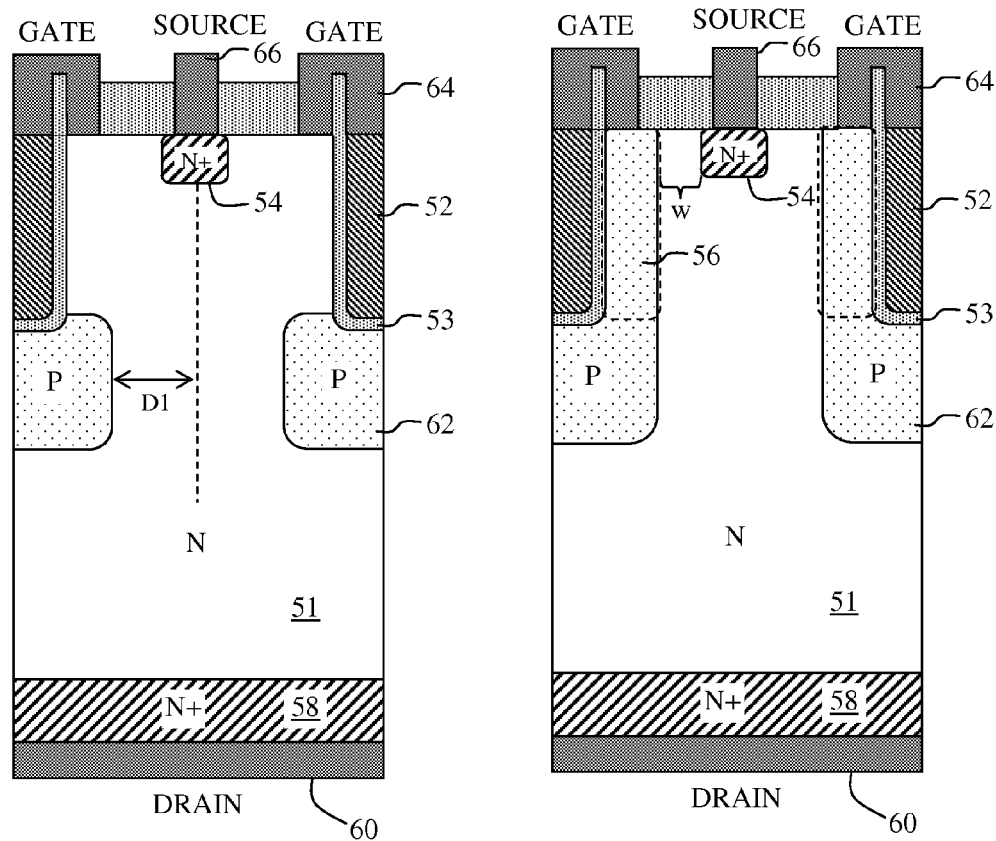
FIG. 3
FIG. 4

NORMALLY ON HIGH VOLTAGE SWITCH

CROSS REFERENCE TO OTHER APPLICATIONS

This application is a continuation of co-pending U.S. patent application Ser. No. 13/945,784, entitled NORMALLY ON HIGH VOLTAGE SWITCH, filed Jul. 18, 2013, now U.S. Pat. No. 9,082,790, issued Jul. 14, 2015, which is incorporated herein by reference for all purposes.

BACKGROUND OF THE INVENTION

In some high voltage power supply applications, an AC-to-DC converter is used to convert an AC input voltage, such as an AC line voltage from a power outlet, to a regulated DC output voltage at a desired output voltage level. To meet regulatory requirements, AC-to-DC converters are often designed with power factor correction (PFC) to achieve a high power factor while reducing total harmonic distortion. Various topologies exist for AC-to-DC converters incorporating power factor correction (PFC). For example, a conventional boost topology uses a bridge rectifier (also referred to as a diode bridge) to rectify the AC input voltage to DC followed by a boost converter functioning as an active PFC circuit.

FIG. 1 is a schematic diagram illustrating a part of the circuitry of a conventional AC-to-DC power converter. Referring to FIG. 1, a power converter 10 receives an AC input voltage $V_{AC}$ 12 and generates one or more regulated DC output voltages, typically at voltage levels lower than the AC input voltage. The power converter 10 includes a diode bridge 14 for converting the AC input voltage $V_{AC}$ 12 to a fully rectified DC voltage $V_{DC}$. The fully rectified DC voltage $V_{DC}$ is coupled to a power factor correction (PFC) circuit which is implemented as a boost converter in the present example. The PFC boost converter may include an isolation transformer with the primary winding 16 driven by a switching transistor Q1, usually a MOSFET transistor. The switching transistor Q1 is being turned on and off under the control of a control circuit, such as PWM control circuit 24. The source terminal of NMOS transistor Q1 is connected to the ground potential (node 22) while the drain terminal is connected to the primary winding 16 (node 18).

In order for the AC-to-DC power converter 10 to operate, the PWM control circuit 24 needs a source of power (voltage Vdd) to turn on so as to drive the switching transistor Q1. The power supply voltage Vdd for the PWM control circuit 24 is typically generated from the same AC input voltage $V_{AC}$. The power converter 10 typically includes a start-up circuit to supply power to the PWM control circuit 24 as the AC power is being turned on. For example, it is known to use a normally on device, such as a JFET, an ACCUFET, or a Depletion mode MOSFET, at the DC voltage node to charge up the power supply voltage Vdd so that the control circuit can turn on to start the power converter operation. In the present example, a JFET J1 is coupled between the primary winding (node 18) and a capacitor C1 (node 20). The capacitor C1 provides the power supply voltage Vdd to the PWM control circuit 24. As soon as the AC voltage $V_{AC}$ is turned on, JFET J1 is conducting and the capacitor C1 is charged up to provide PWM control circuit 24 with the power supply voltage Vdd. When the voltage at capacitor C1 reaches a threshold level, the PWM control circuit 24 turns on to control switching transistor Q1. The AC-to-DC power converter then operates to generate the power supply voltage Vdd for the PWM control circuit 24. Once the power supply voltage Vdd (node 20) reaches the threshold level, the JFET J1 is turned off. In some embodiment, the JFET J1 is an N-channel device and the threshold voltage to shut off the JFET is a gate-to-source voltage $V_{GS}$ of about −5V.

BRIEF DESCRIPTION OF THE DRAWINGS

Various embodiments of the invention are disclosed in the following detailed description and the accompanying drawings.

FIG. 2 is a top view of an N-channel normally on high voltage switch device with a trench gate and buried doped gate region according to embodiments of the present invention.

FIG. 3 is a cross-sectional view of the normally on high voltage switch device of FIG. 2 along the line A-A'.

FIG. 4 is a cross-sectional view of the normally on high voltage switch device of FIG. 2 along the line B-B'.

DETAILED DESCRIPTION

Figure 1:
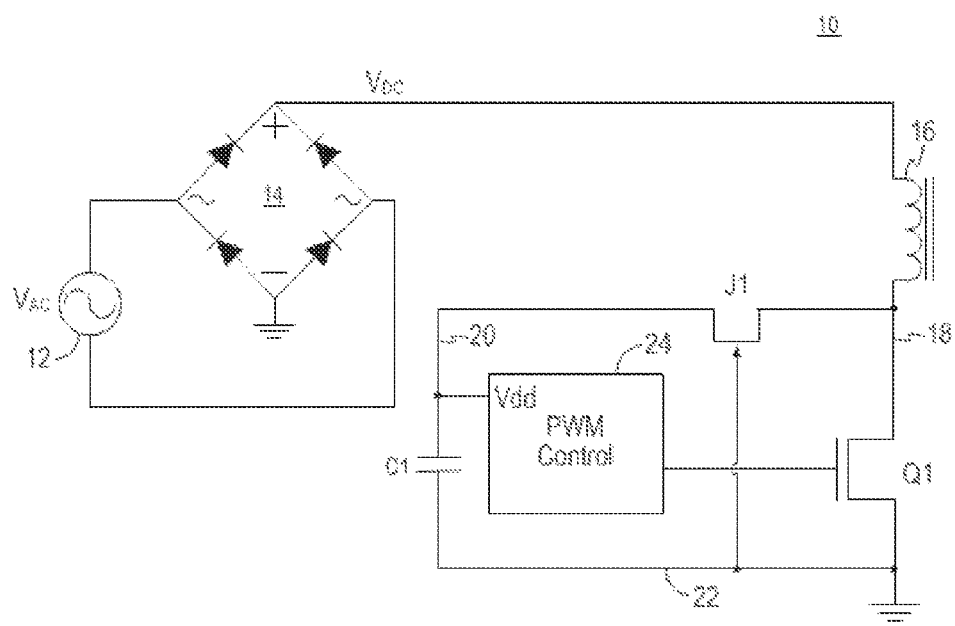
FIG. 1 is a schematic diagram illustrating a part of the circuitry of a conventional AC-to-DC power converter.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, normally on high voltage switches are formed using high-voltage trench MOSFET fabrication processes. In some embodiments, a normally on high voltage switch device is formed using trench MOSFET fabrication processes and the normally on high voltage switch device incorporates a trench gate terminal and buried doped gate region. In other embodiments, a surface gate controlled normally on high voltage switch device incorporates a surface channel controlled by a surface gate terminal and may incorporate a trench gate terminal or buried doped gate region. The normally on high voltage switch devices thus constructed can be readily integrated with MOSFET devices and formed using existing high voltage MOSFET fabrication technologies, particularly trench MOSFET fabrication processes. In some embodiments, the normally on high voltage switch devices of the present invention are formed on the same integrated circuit as a power MOSFET for use as the normally on device in AC-to-DC power converter applications. In one example, the normally on high voltage switch device is formed to share a common drain with a high-voltage MOSFET device. In other embodiments, the normally on high voltage switch devices can be formed as discrete devices on standalone integrated circuits. The discrete devices can be formed using reduced number of processing steps of a conventional trench MOSFET fabrication process.

In embodiments of the present invention, the normally on high voltage switch devices are constructed based on a JFET device structure. In the present description, a junction field-effect transistor (JFET) refers to a semiconductor device where electric charge flows through a semiconducting channel between a source terminal and a drain terminal. The channel has a first conductivity type while a gate region is formed in the channel having a second, opposite conductivity type. JFET can be formed as an N-channel device with the channel formed using N-type conductivity or as a P-channel device with the channel formed using P-type conductivity. The operation of the JFET device is based on reverse-biasing the pn junction formed between the gate region and the channel to modulate the width of the depletion region formed at the gate-channel junction. Reverse-biasing the gate-channel pn junction controls the width of the depletion region which in turns controls the width of the remaining channel and hence the current flow from the drain to the source. The magnitude of the current flow between the drain and the source also depends on the electric field or the applied voltage between the source and drain terminals. In particular, by applying a reverse bias voltage to the gate region relative to the source region, the conducting channel is pinched by the depletion region so that the electric current is impeded or switched off completely. To switch off an N-channel JFET device, a negative gate-source voltage ($V_{GS}$) is used. Conversely, to switch off a P-channel JFET device, a positive gate-source voltage ($V_{GS}$) is used.

Normally On Switch with Trench Gate and Buried Doped Gate Region

In embodiments of the present invention, a normally on high voltage switch device ("normally on switch device") is constructed as an N-channel switch device and includes a semiconducting channel having N-type conductivity formed between a top N+ region forming the source terminal and a bottom N+ region forming the drain terminal. The gate terminal of the normally on switch device includes a trench gate and a buried doped gate region. In some embodiments, the trench gate is formed in a polysilicon filed trench structure and the buried doped gate region is a P-type region formed as a trench bottom doped region. When the gate terminal is biased negatively relative to the source, a depletion region is formed encroaching on the semiconducting channel. When sufficient negative bias is applied to the gate terminal relative to the source terminal, the depletion region chokes off the conducting channel entirely to turn off the N-channel normally on switch device.

In other embodiments, a normally on switch device is constructed as a P-channel switch device and includes a trench gate and a buried doped gate region formed in the same manner as described above but using doped regions and bias voltages of the opposite polarities. That is, the P-type normally on switch device includes a semiconducting channel of P-type conductivity and P+ regions as the source and drain terminals. The P-type normally on switch device includes a trench gate and an N-type region formed underneath the trench structure as the gate region. The gate terminal receives a positive bias relative to the source to turn off the P-channel normally on switch device.

FIG. 2 is a top view of an N-channel normally on high voltage switch device ("normally on switch device") with a trench gate and buried doped gate region according to embodiments of the present invention. FIG. 3 is a cross-sectional view of the normally on switch device of FIG. 2 along the line A-A' and FIG. 4 is a cross-sectional view of the normally on switch device of FIG. 2 along the line B-B'. In embodiments of the present invention, the normally on switch device is formed using a trench MOSFET fabrication process. Referring to FIGS. 2-4, an N-channel normally on switch device 50 is formed in an N-type epitaxial layer 51 formed on an N+ substrate 58. An N+ doped region 54 is formed on a first surface (e.g. the top surface) of the N-type epitaxial layer 51 as the source region. A conductive electrode 66, such as a metal electrode, is formed in ohmic contact with the source region 54 as the source terminal of the normally on switch device 50. In the present embodiment, the N+ substrate 58 is the drain region of the normally on switch device. A backside conductive electrode 60 is formed in ohmic contact with the N+ substrate 58 to form the drain terminal of the normally on switch device 50. The N-type epitaxial layer 51 between the source region 54 and the drain region 58 forms the semiconducting channel of the normally on switch device 50.

The normally on switch device 50 is formed between trench structures 52. In the present embodiment, the trench structures 52 are also used to form a trench gate for the normally on switch device. More specifically, during the fabrication of normally on switch device 50, trench openings are formed in the N-type epitaxial layer 51. Then, ion implantation using P-type dopants is performed to form trench bottom doped regions 62 as the buried P-type gate regions of the normally on switch device 50. The trench openings are then lined with an insulating layer, such as a silicon oxide layer 53, and are filled with a conductive material, such as polysilicon. The polysilicon-filled trenches 52 and the P-type gate regions 62 are electrically connected together as the gate terminal of the normally on switch device 50. In some embodiments, a conductive electrode 64 is formed on the trench structure 52 to electrically connect to the trench gate and to the buried P-type gate region 62 formed underneath.

In some embodiments, a P-type gate region 62 is electrically connected to the gate electrode 64 by a trench sidewall doped region 56. In particular, trench sidewall doped regions 56 are formed in spaced apart intervals along the length of the trench structures 52, as shown in FIG. 2. The trench sidewall doped regions 56 extend from the first surface of the epitaxial layer 51 down to the trench bottom doped regions 62 to electrically connect the P-type gate regions 62 to the gate electrodes 64. In one embodiment, the trench sidewall doped regions 62 are formed using as sidewall implantation where P-type dopants are implanted into the sidewall of the trench openings, such as using an angled implant, before the trench openings are filled. In other embodiments, the trench sidewall doped regions 62 are formed using surface implantation into the epitaxial layer 51. The trench sidewall doped regions 62, besides providing electrical connection between the gate electrode 64 and the P-type gate region 62, also function to help pinch off the conducting channel when the gate terminal is negatively biased.

The trench gate 52 serves two purposes in the normally on switch device operation. First, the trench gate 52 realizes charge balancing with the N-type channel region 51 formed by the mesa between the trenches. It allows the mesa region to be more heavily doped, thereby reducing its series resistance. Second, the trench gate helps to pinch-off the current flow path in the channel when the gate terminal is negatively biased relative to the source terminal.

In the N-channel normally on switch device operation, when zero voltage is applied between the gate terminal 64 and the source terminal 66, the normally on switch device 50 is normally on and current flows from the source region 54 to the drain region 58. When the normally on switch device 50 is to be turned off, the gate terminal, including the trench gate 52 and the buried P-type gate region 62, is negatively biased relative to the source terminal 66 in order to pinch off the conducting channel between the source region 54 and the drain region 58. The width of the channel region determines the amount of negative bias voltage that needs to be applied to turn off the normally on switch device 50.

Surface Gate Controlled Normally On Switch device

Figure 5:
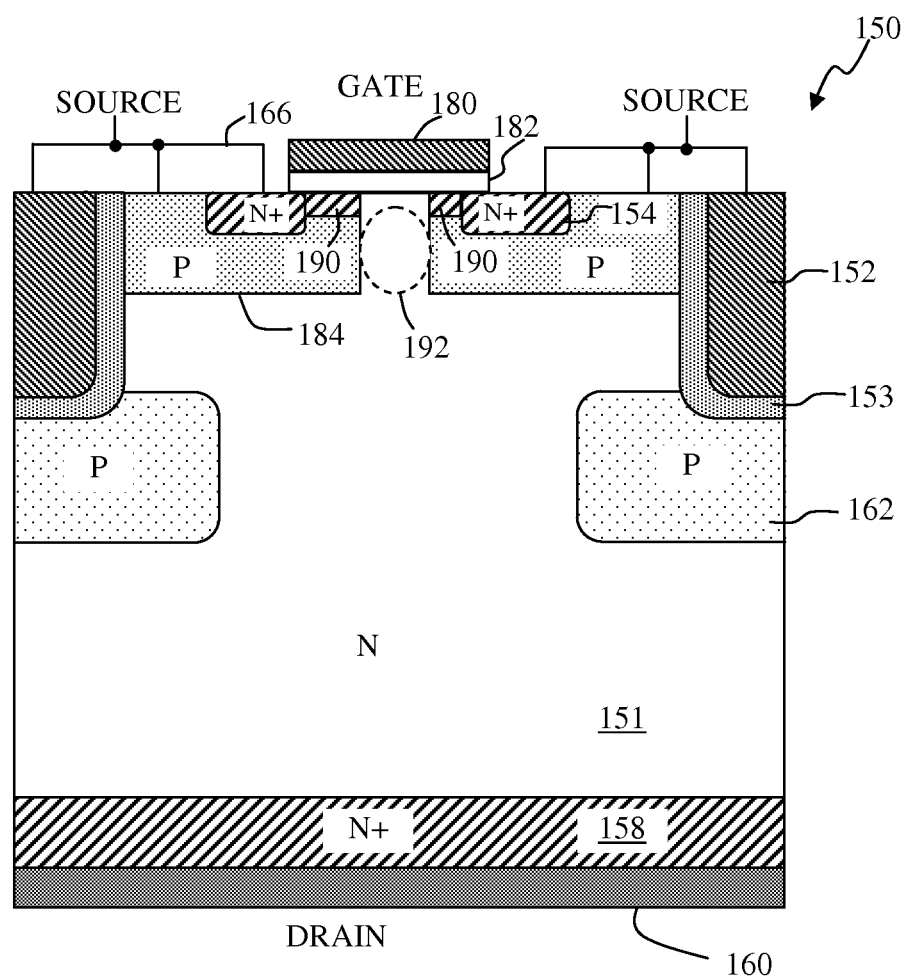
FIG. 5 is a cross-sectional view of a surface gate controlled normally on high voltage switch device according to embodiments of the present invention.
Figure 6:
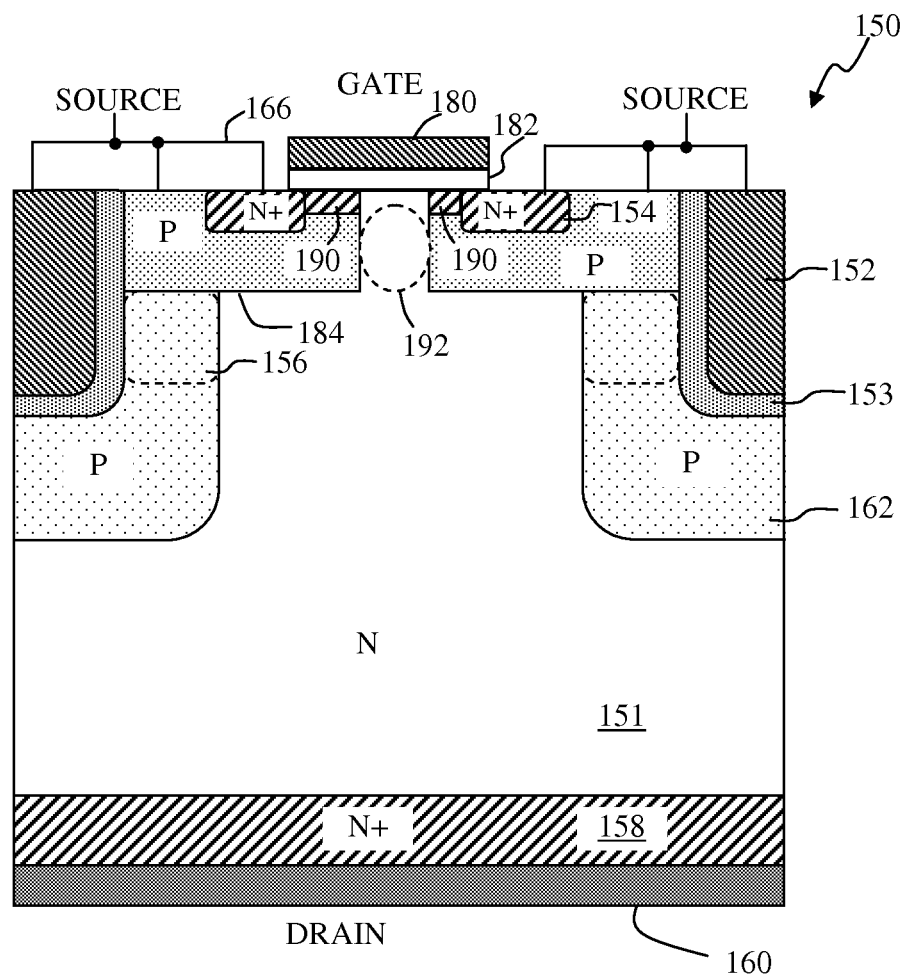
FIG. 6 is a cross-sectional view of a surface gate controlled normally on high voltage switch device according to embodiments of the present invention.

FIGS. 5 and 6 are cross-sectional views of a surface gate controlled normally on high voltage switch device ("normally on switch device") according to embodiments of the present invention. FIGS. 5 and 6 are cross-sectional views taken at difference locations along the length of the surface gate controlled normally on switch device. In embodiments of the present invention, the surface gate controlled normally on switch device is formed using a trench MOSFET fabrication process. Referring to FIGS. 5-6, a surface gate controlled normally on switch 150 is formed in an N-type epitaxial layer 151 formed on an N+ substrate 158. An N+ doped region 154 is formed on a first surface (e.g. the top surface) of the N-type epitaxial layer 151 as the source region. A conductive electrode 166, such as a metal electrode, is formed in ohmic contact with the source region 154 as the source terminal of the normally on switch device 150. In the present embodiment, the N+ substrate 158 is the drain region of the normally on switch device. A backside conductive electrode 160 is formed in ohmic contact with the N+ substrate 158 to form the drain terminal of the normally on switch device 150.

The surface gate controlled normally on switch device 150 is bound by trench structures 152. The trench structures 152 are lined with a dielectric layer 153 and filled with a conductive layer, such as polysilicon. The surface gate controlled normally on switch device 150 may further include P-type trench bottom doped regions 162 formed underneath trench structures 152. In the present embodiment, the trench structures 152 are electrically shorted to the source terminal 166 of the normally on switch device to realize charge balancing in the mesa region between the trenches.

In the present embodiment, the trench bottom doped regions 162 are also electrically shorted to the source terminal 166 of the normally on switch device. In some embodiments, the trench bottom doped region 162 may be electrically shorted to the source terminal 166 by a P-type trench sidewall doped region 156 (FIG. 6) which may be formed spaced apart along the length of the trench structures, in the same manner as regions 56 shown in FIG. 2. In other embodiments, the trench bottom doped regions 162 can be electrically shorted to the gate electrode 180 of the normally on switch device to function as a buried doped gate region. The trench bottom doped regions 162 aid in pinching off the vertical channel of the normally on switch device 150.

Figure 7:
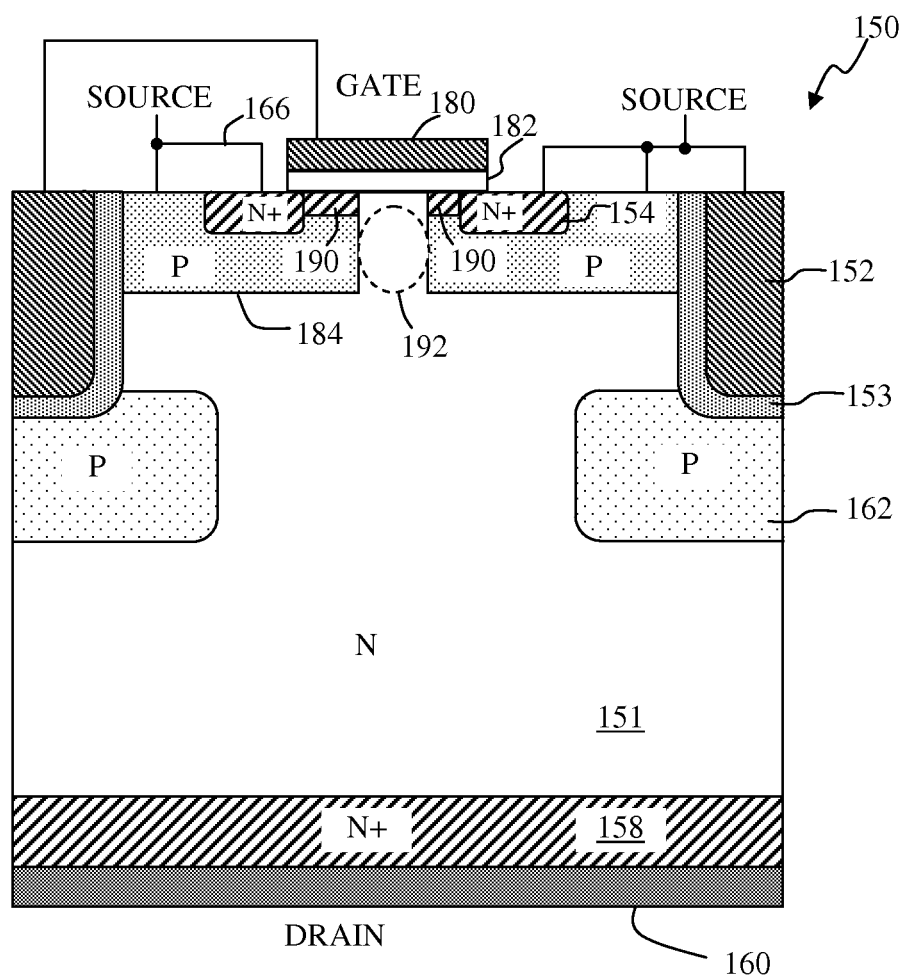
FIG. 7 is a cross-sectional view of a surface gate controlled normally on high voltage switch device according to alternate embodiments of the present invention.
Figure 8:
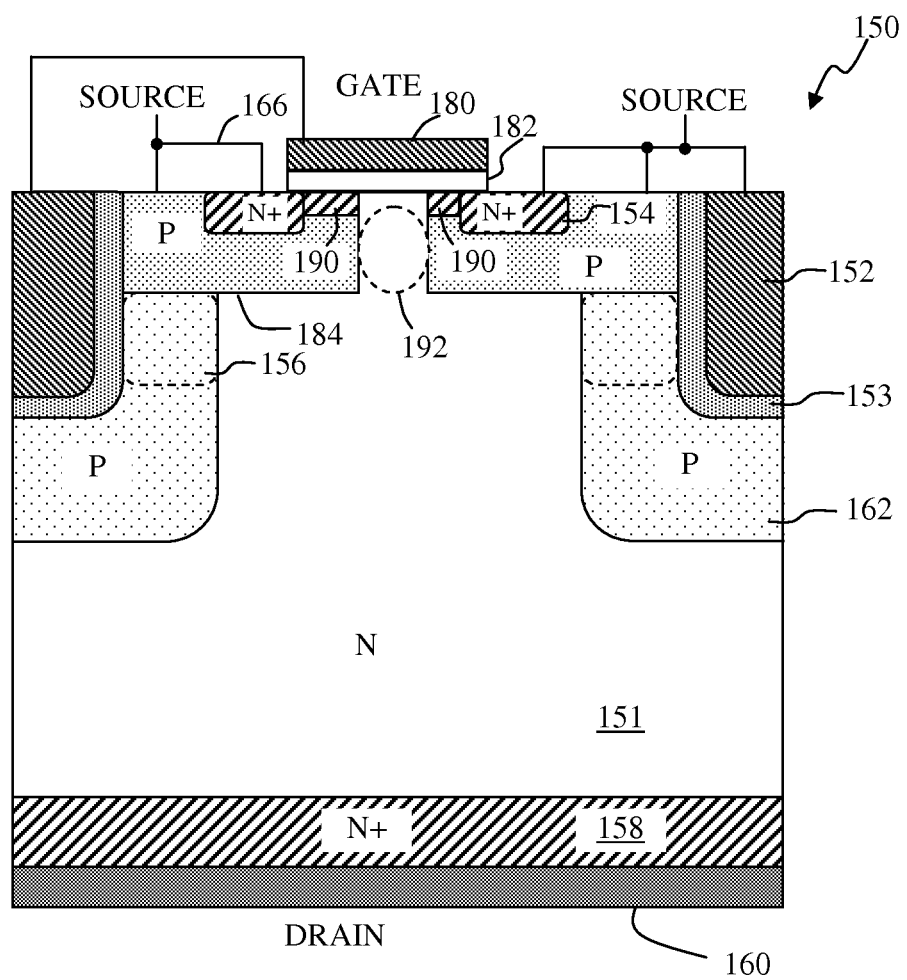
FIG. 8 is a cross-sectional view of a surface gate controlled normally on high voltage switch device according to alternate embodiments of the present invention.
Figure 9:
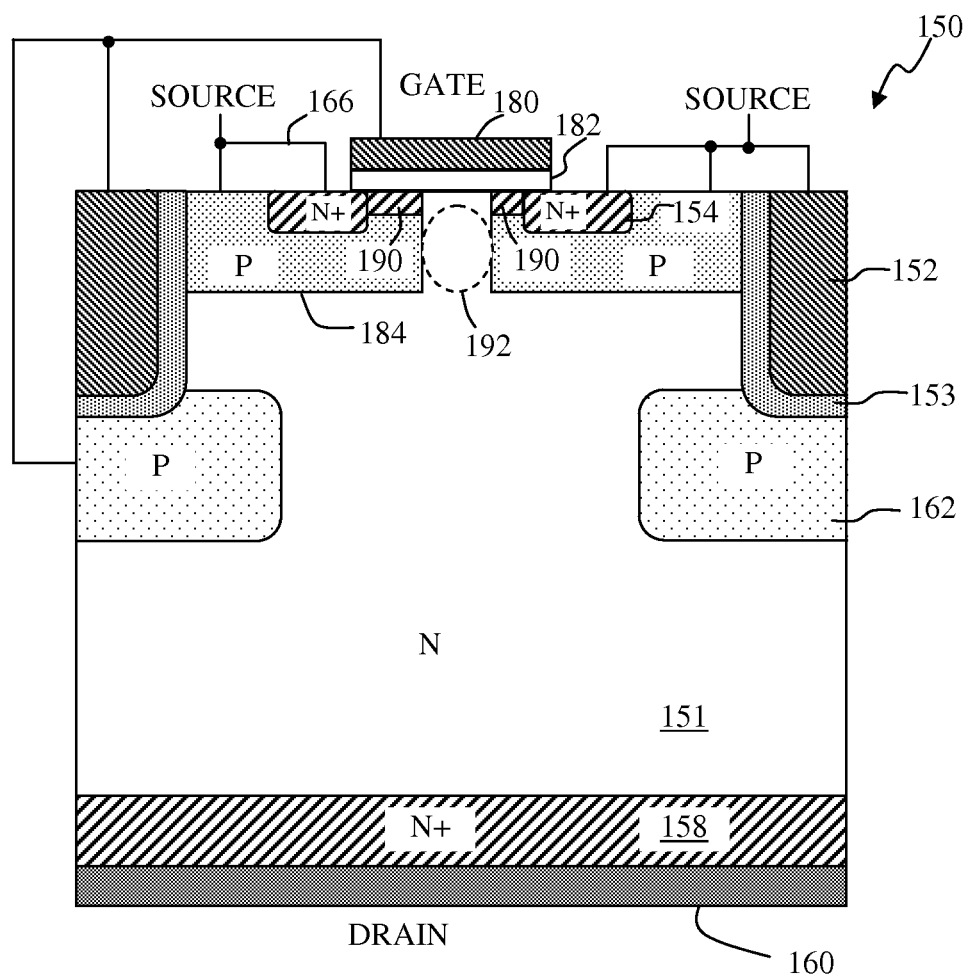
FIG. 9 is a cross-sectional view of a surface gate controlled normally on high voltage switch device according to alternate embodiments of the present invention.

In alternate embodiments of the present invention, the trench structures 152 can be electrically connected to the gate electrode 180 of the normally on switch device to function as trench gate electrodes to provide additional bias to pinch off the current conduction path during the off state of the normally on switch device, as shown in FIG. 7. In some embodiments, the trench bottom doped regions 162 can be electrically shorted to the source terminal 166 of the normally on switch device, such as through using a P-type trench sidewall doped region 156, as shown in FIG. 8. The P-type trench sidewall doped region 156 may be formed spaced apart along the length of the trench structures, in the same manner as regions 56 shown in FIG. 2. In yet another alternate embodiment, the trench bottom doped regions 162 can be electrically shorted to the gate electrode 180 of the normally on switch device to function as a buried doped gate region, as shown in FIG. 9. The trench bottom doped regions 162 aid in pinching off the vertical channel of the normally on switch device 150.

The surface gate controlled normally on switch 150 includes a conducting channel formed by a surface channel region 190 and a vertical channel region. The surface channel region 190 is formed under and controlled by a surface or planar gate electrode 180 and functions as a drift region. The surface channel region 190 is connected to the vertical channel region to form a conducting channel between the N+ source region 154 formed at the top surface of epitaxial layer 151 and the N+ drain region formed by the N+ substrate 158. The N-type epitaxial layer 151 between surface channel region 190 and the drain region 158 forms the vertical channel region of the normally on switch device 150.

In some embodiments, the surface gate electrode 180 is formed in a similar manner to a gate electrode of a MOS transistor. In particular, the gate electrode 180, typically a polysilicon gate, is formed on the top surface of N-type epitaxial layer 151 and is insulated from the substrate by a dielectric layer 182, typically a gate oxide layer. A P-type body region 184 is formed in the N-type epitaxial layer 151 and the N+ doped region 154 is formed in the P-type body region on the side of gate electrode 180 as the source region of the normally on switch device 150. The N+ region 154 is more heavily doped than the P-type body region 184. In some embodiments, N+ doped regions 154 can be formed self-aligned to the sides of the gate electrode 180. The P-type body region 184 extends beyond the N+ source region 154 towards a center portion of the surface channel region. However, adjacent P-type body regions formed on the sides of the gate electrode 180 do not meet but rather leaves a vertical channel portion 192 to form the conducting channel between source region 154 and the drain region 158. In one embodiment, the P-type body region extends a first distance under the gate electrode 180 where the first distance is less than half the length of the gate electrode 180. The P-type body region 184 is electrically connected to the source terminal 166. For example, a conductive electrode can be formed to electrically connect the P-type body region 184 and the N+ source region 154. The trench structures 152 can be either connected to the source terminal, or the gate electrode.

In embodiments of the present invention, the surface channel region 190 is formed by surface implantation of N-type dopants into the P-body region 184. The surface implant is of sufficient concentration to compensate the P-body doping at the surface. As a result, a thin surface channel region 190 is formed below the gate oxide and above the P-type body region 184. The thin surface channel region 190 provides a direct path for current flow from the source region 154 to the drain region 158. The thin N-type surface channel region 190 can have a thickness in the range of 50 nm to 300 nm.

In operation, when zero voltage is applied between the gate electrode 180 and the source terminal 166, the normally on switch device 150 is normally on and current flows from the source region 154 through the surface channel region 190 and the vertical channel portion 192 to the drain region 158. When a negative gate bias is applied to the gate electrode 180 relative to the source terminal, the gate electrode 180 depletes the N-type surface channel region 190, thereby shutting off the current path from the source terminal 166 to the drain terminal 160. The normally on switch device 150 is thus turned off. The depth of the surface channel region 190 and the doping level of the P-type body region 184 determine the amount of negative bias voltage that needs to be applied to turn off the normally on switch device 150. In the case the trench structures 152 are electrically connected to the gate electrode 180 (FIG. 7) and the trench gate electrodes are also negatively biased relative to the source terminal, the trench gate electrodes deplete the N-type mesa region between the trenches, thereby aiding in the shutting off of the current path from the source terminal 166 to the drain terminal 160. Furthermore, in the case the trench bottom doped regions 162 are also electrically connected to the gate electrode 180 (FIG. 9), the trench bottom doped regions 162 also aid in shutting off the current path from the source terminal 166 to the drain terminal 160.

In embodiments of the present invention, the normally on switch devices described above can be constructed using the high voltage trench MOSFET fabrication process described in commonly assigned, copending U.S. patent application Ser. No. 13/199,381, filed Aug. 25, 2011, entitled "Buried Field Ring Field Effect Transistor (BUF-FET) Integrated With Cells Implanted With Hole Supply Path," of Madhur Bobde et al. The patent application is incorporated herein by reference in its entirety.

The above-described embodiments illustrate the construction of N-channel normally on switch devices using trench MOSFET fabrication process technologies. One of ordinary skill in the art would appreciate that a P-channel normally on switch device can be formed in the same manner by using doped regions of reversed polarities. That is, a P-channel normally on switch device can be formed using a P-type substrate as the semiconducting channel, P+ regions as the source and drain terminals and an N+ region as the gate region or the body region. The P-channel normally on switch device can be operated using applied voltages of the reverse polarities. Furthermore, the normally on switch device of the present invention can be formed on the same substrate as other MOSFET devices or the normally on switch device can be formed as a discrete transistor device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A normally on high voltage switch device ("normally on switch device"), comprising:
   a first semiconductor layer of a first conductivity type, the first semiconductor layer being heavily doped and forming a drain region of the normally on switch device;
   a second semiconductor layer of the first conductivity type formed on the first semiconductor layer;
   a first trench and a second trench formed spaced apart in the second semiconductor layer, each of the first trench and the second trench being lined with an insulating layer and filled with a conductive material to form a trench gate of the normally on switch device;
   a first doped region of a second conductivity type, opposite the first conductivity type, formed under the first trench in the second semiconductor layer and a third doped region of the second conductivity type formed under the second trench in the second semiconductor layer, the first and third doped regions being electrically connected to the conductive material in the respective first and second trenches to form a gate terminal of the normally on switch device; and
   a second doped region of the first conductivity type formed on a first surface of the second semiconductor layer between the first and second trenches, the second doped region being heavily doped and forming a source region of the normally on switch device,
   wherein the normally on switch device comprises a channel formed in the second semiconductor layer between the source region and the drain region and the channel has a width controlled by the gate terminal formed by the trench gate and the first and third doped regions, and in response to a reverse bias voltage being applied to the gate terminal relative to the source region, a depletion region is formed at the junction of the first and third doped regions and the second semiconductor layer to modulate the width of the channel and to pinch off the channel to switch off the normally on switch device.

2. The normally on switch device of claim 1, further comprising:
   a trench sidewall doped region of the second conductivity type formed along the sidewall of each of the first trench and second trench and in physical and electrical contact with the respective first doped region and third doped region; and
   a first conductive electrode formed in electrical contact with the trench gate and the trench sidewall doped region, the conductive electrode forming the gate terminal of the normally on switch device.

3. The normally on switch device of claim 2, wherein the trench sidewall doped region comprises a plurality of trench sidewall doped region formed spaced apart along a length of the first trench and along a length of the second trench.

4. The normally on switch device of claim 2, wherein the trench sidewall doped region is spaced apart from the second doped region.

5. The normally on switch device of claim 1, wherein each of the first trench and second trench is lined with a silicon oxide layer and filled with a polysilicon layer.

6. The normally on switch device of claim 1, further comprising:
   a second conductive electrode formed in electrical contact with the second doped region, the second conductive electrode forming a source terminal.

7. The normally on switch device of claim 1, further comprising:
a third conductive electrode formed in electrical contact with the first semiconductor layer, the third conductive electrode forming a drain terminal.

8. The normally on switch device of claim 1, wherein the first conductivity type is N-type and the second conductivity type is P-type.

9. A method for forming a normally on high voltage switch device ("normally on switch device"), comprising:
providing a first semiconductor layer of a first conductivity type, the first semiconductor layer being heavily doped and forming a drain region of the normally on switch device;
providing a second semiconductor layer of the first conductivity type formed on the first semiconductor layer;
forming a first trench and a second trench being spaced apart in the second semiconductor layer, each of the first trench and the second trench being lined with an insulating layer and filled with a conductive material to form a trench gate of the normally on switch device;
forming a first doped region of a second conductivity type, opposite the first conductivity type, under the first trench in the second semiconductor layer and forming a third doped region of the second conductivity type under the second trench in the second semiconductor layer, the first and third doped regions being electrically connected to the conductive material in the respective first and second trenches to form a gate terminal of the normally on switch device; and
forming a second doped region of the first conductivity type on a first surface of the second semiconductor layer between the first and second trenches, the second doped region being heavily doped and forming a source region of the normally on switch device,
wherein the normally on switch device comprises a channel formed in the second semiconductor layer between the source region and the drain region and the channel has a width controlled by the gate terminal formed by the trench gate and the first and third doped regions, and in response to a reverse bias voltage being applied to the gate terminal relative to the source region, a depletion region is formed at the junction of the first and third doped regions and the second semiconductor layer to modulate the width of the channel and to pinch off the channel to switch off the normally on switch device.

10. The method of claim 9, further comprising:
forming a trench sidewall doped region of the second conductivity type along the sidewall of each of the first trench and second trench and in physical and electrical contact with the respective first doped region and third doped region; and
forming a first conductive electrode in electrical contact with the trench gate and the trench sidewall doped region, the conductive electrode forming the gate terminal of the normally on switch device.

11. The method of claim 10, wherein forming a trench sidewall doped region comprises:
forming a plurality of trench sidewall doped region spaced apart along a length of the first trench and along a length of the second trench.

12. The method of claim 10, wherein forming a trench sidewall doped region comprises:
forming the trench sidewall doped region spaced apart from the second doped region.

13. The method of claim 9, further comprising:
lining each of the first trench and second trench with a silicon oxide layer and filling each of the first trench and second trench with a polysilicon layer.

14. The method of claim 9, further comprising:
forming a second conductive electrode in electrical contact with the second doped region, the second conductive electrode forming a source terminal.

15. The method of claim 9, further comprising:
forming a third conductive electrode in electrical contact with the first semiconductor layer, the third conductive electrode forming a drain terminal.

16. The method of claim 9, wherein the first conductivity type is N-type and the second conductivity type is P-type.

17. A normally on high voltage switch device ("normally on switch device"), comprising:
a drain region formed in a first semiconductor layer of a first conductivity type, the first semiconductor layer being heavily doped;
a source region formed on a first surface of a second semiconductor layer of the first conductivity type, the second semiconductor layer being formed on the first semiconductor layer and the first surface being a surface opposite from the first semiconductor layer;
a trench gate formed in the second semiconductor layer, the trench gate being formed by a first trench and a second trench formed spaced apart in the second semiconductor layer on the sides of and being spaced apart from the source region, the first trench and the second trench being lined with an insulating layer and filled with a conductive material to form the trench gate of the normally on switch device; and
a buried doped gate region of a second conductivity type, opposite the first conductivity type, formed under the respective first and second trenches in the second semiconductor layer, the buried doped gate region being electrically connected to the conductive material in the respective first and second trenches to form a gate terminal of the normally on switch device,
wherein the normally on switch device comprises a channel formed in the second semiconductor layer between the source region and the drain region and the channel has a width controlled by the gate terminal formed by the trench gate and the buried doped gate region, and in response to a reverse bias voltage being applied to the gate terminal relative to the source region, a depletion region is formed at the junction of the buried doped gate region and the second semiconductor layer to modulate the width of the channel and to pinch off the channel to switch off the normally on switch device.

18. The normally on switch device of claim 17, further comprising:
a trench sidewall doped region of the second conductivity type formed along the sidewall of each of the first trench and second trench and in physical and electrical contact with the buried doped gate region; and
a first conductive electrode formed in electrical contact with the trench gate and the trench sidewall doped region, the conductive electrode forming the gate terminal of the normally on switch device.

19. The normally on switch device of claim 18, wherein the trench sidewall doped region comprises a plurality of trench sidewall doped region formed spaced apart along a length of the first trench and along a length of the second trench.

20. The normally on switch device of claim 18, wherein the trench sidewall doped region is spaced apart from the source region.

* * * * *